United States Patent
Lim et al.

(10) Patent No.: US 8,192,849 B2
(45) Date of Patent: Jun. 5, 2012

(54) ORGANIC LIGHT EMITTING DISPLAY DEVICE

(75) Inventors: Choon-Woo Lim, Suwon-si (KR);
Kwan-Hee Lee, Suwon-si (KR);
Sung-Jun Bae, Suwon-si (KR);
Sang-Shin Lee, Suwon-si (KR);
Ji-Hwan Yoon, Suwon-si (KR);
Eun-Jung Lee, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 716 days.

(21) Appl. No.: 12/360,347

(22) Filed: Jan. 27, 2009

(65) Prior Publication Data

US 2009/0315452 A1 Dec. 24, 2009

(30) Foreign Application Priority Data

Jun. 19, 2008 (KR) .................. 10-2008-0058051

(51) Int. Cl.
*H01L 51/54* (2006.01)
(52) U.S. Cl. ......... 428/690; 428/917; 313/504; 313/506
(58) Field of Classification Search ........................ None
See application file for complete search history.

(56) References Cited

U.S. PATENT DOCUMENTS 6,566,807 B1 * 5/2003 Fujita et al. .................. 313/506
7,615,790 B2 * 11/2009 Lee ................................. 257/79

FOREIGN PATENT DOCUMENTS

| KR | 10-0685419 | 2/2007 |
| KR | 10-0776872 | 11/2007 |
| KR | 10-0787452 | 12/2007 |
| KR | 10-2008-0012177 | 2/2008 |

OTHER PUBLICATIONS

Machine translation for KR 10-0685419, date Feb. 2007.*
Machine translation for KR 10-0787452, date Dec. 2007.*
Machine translation for KR 10-0776872, date Nov. 2007.*
Machine translation for KR 10-2008-0012177, Feb. 2008.*
Korean Office Action issued Mar. 30, 2010, in corresponding Korean Patent Application No. 10-2008-0058051.
English-language abstract of Korean Publication No. 10-2006-0055053, Date: 2006.
English-language abstract of Korea Publication No. 10-2001-0107618, Date: 2001.
Korean Office Action dated Jul. 30, 2010, issued in corresponding Korean Patent Application No. 10-2008-0058051.

* cited by examiner

*Primary Examiner* — Dawn L. Garrett
(74) *Attorney, Agent, or Firm* — Robert E. Bushnell, Esq.

(57) ABSTRACT

An organic light emitting display device that can reach the optimum light emitting efficiency of each pixel while operating at a low voltage. The organic light emitting display device includes a first pixel region emitting a first color, a second pixel region emitting a second color different from the first color, a first layer formed over the first and second pixel regions, and having at least one of a hole injection layer and a hole transport layer, and a second layer formed over the first and second pixel regions, and having hole injectivity higher than the first layer, wherein the first and second layers are sequentially deposited in the first pixel region, and the second and first layers are sequentially deposited in the second pixel region.

25 Claims, 5 Drawing Sheets

ORGANIC LIGHT EMITTING DISPLAY DEVICE

CROSS-REFERENCE TO RELATED APPLICATION

This application claims the benefit of Korean Patent Application No. 2008-58051, filed on Jun. 19, 2008 in the Korean Intellectual Property Office, the disclosure of which is incorporated herein in its entirety by reference.

BACKGROUND OF THE INVENTION

1. Field of the Invention

Aspects of the present invention relate to an organic light emitting display device, and more particularly, to an organic light emitting display device that can reach the optimum light emitting efficiency of each pixel.

2. Description of the Related Art

Recently, portable thin flat display devices have been replacing standard display devices. Among flat display devices, organic light emitting display devices have the advantages of a large viewing angle, excellent contrast, and a quick response speed, and thus are being developed for the next generation of display devices.

Various attempts have been made to decrease power consumption and increase the efficiency of such organic light emitting display devices. For example, a material having a charged carrier with high mobility is used in a hole injection layer, a hole transport layer, or the like, so as to obtain low power consumption, high efficiency, and long durability.

However, when a full color device is manufactured using such a material having a charged carrier with high mobility, a horizontal leakage current may be generated because of the high mobility of the charged carrier in the hole injection layer and the hole transport layer. This is because the hole injection layer and the hole transport layer are formed from a common layer that is in turn formed over all pixels, and when one color is lighted, an adjacent pixel having a different color also lights up because of a horizontal leakage current. Accordingly, it is difficult to realize colors and to express gray scale in low luminescence.

Meanwhile, in a full color organic light emitting display device, pixels according to each color emit lights in different locations in a light emitting layer. For example, red and blue are emitted near the hole transport layer, and green is emitted near the electron transport layer. Here, the hole injection layer and the hole transport layer are formed of a material having a charged carrier with a high mobility, and when the hole injection layer and the hole transport layer are formed in the same location independent of the characteristics of each pixel, hole injection into the light emitting layer increases in each pixel. Accordingly, light emitting areas for red and blue exist within the light emitting layer, while the light emitting area for green is not in the light emitting layer but exists at the boundary of the light emitting area and the electron transport layer. Thus, the light emitting efficiency of red and blue may increase, while the light emitting efficiency of green may decrease.

SUMMARY OF THE INVENTION

Aspects of the present invention provide an organic light emitting display device that can reach the optimum light emitting efficiency of each pixel, while operating with a low voltage. This aspect of the present invention provides an organic light emitting display device including: a plurality of pixel regions emitting a plurality of colors; a first layer formed over the plurality of pixel regions, and having at least one of a hole injection layer and a hole transport layer; and a second layer formed over the plurality of pixel regions, and having a greater capacity for hole injectivity than the first layer, wherein the first and second layers are sequentially deposited in at least one of the pixel regions, and the second and first layers are sequentially deposited in at least one of the pixel regions.

Additionally, the first layer may include at least one hole injection layer and the hole transport layer. Either layer of the hole injection layer or the hole transport layer may be electrically and/or physically connected over two or more of the pixel regions. Either layer of the hole injection layer or the hole transport layer may be electrically and/or physically independent of the same components in an adjacent one of the pixel regions. The second layer may be a hole injection layer having higher charge mobility than the first layer. The second layer may include a charge generating material. The second layer may be electrically or physically connected across two or more pixel regions. The second layer may be electrically or physically independent of the second layer in an adjacent one of the pixel regions.

The charge generating material may be a chemical compound described by the following chemical formula:

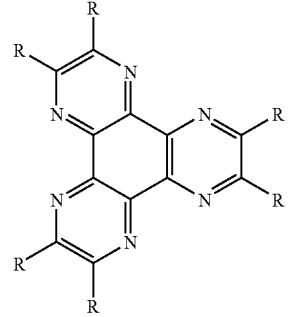

wherein R is a nitrile (—CN), a sulfone (—SO$_2$R'), a sulfoxide (—SOR'), a sulfonamide (—SO$_2$NR'$_2$), a sulfonate (—SO$_3$R'), a nitro (—NO$_2$) group, or a trifluoromethane (—CF$_3$) group, and wherein R' is a C1-C60 alkyl group, a C1-C60 aryl group, or a C1-C60 heterocyclic group that is substituted or unsubstituted with an amine, an amide, an ether, or an ester.

The charge generating material may be formed of one of hexanitrile hexaazatriphenylene, tetrafluoro-tetracyanoquinodomethane (F$_4$-TCNQ), ferric chloride, F$_{16}$CuPc, and a metal oxide. The metal oxide may be one of vanadium pentoxide (V$_2$O$_5$), rhenium heptoxide (Re$_2$O$_7$), and indium tin oxide (ITO). The difference between the lowest unoccupied molecular orbital (LUMO) energy level of the charge generating material in the second layer, and the highest occupied molecular orbital (HOMO) energy level of the material forming the hole injection layer in the first layer may be within a range of −2 and +2 eV. The thickness of the second layer may be between 10 and 200 Å. Preferably, the thickness of the second layer may be between 20 and 80 Å.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
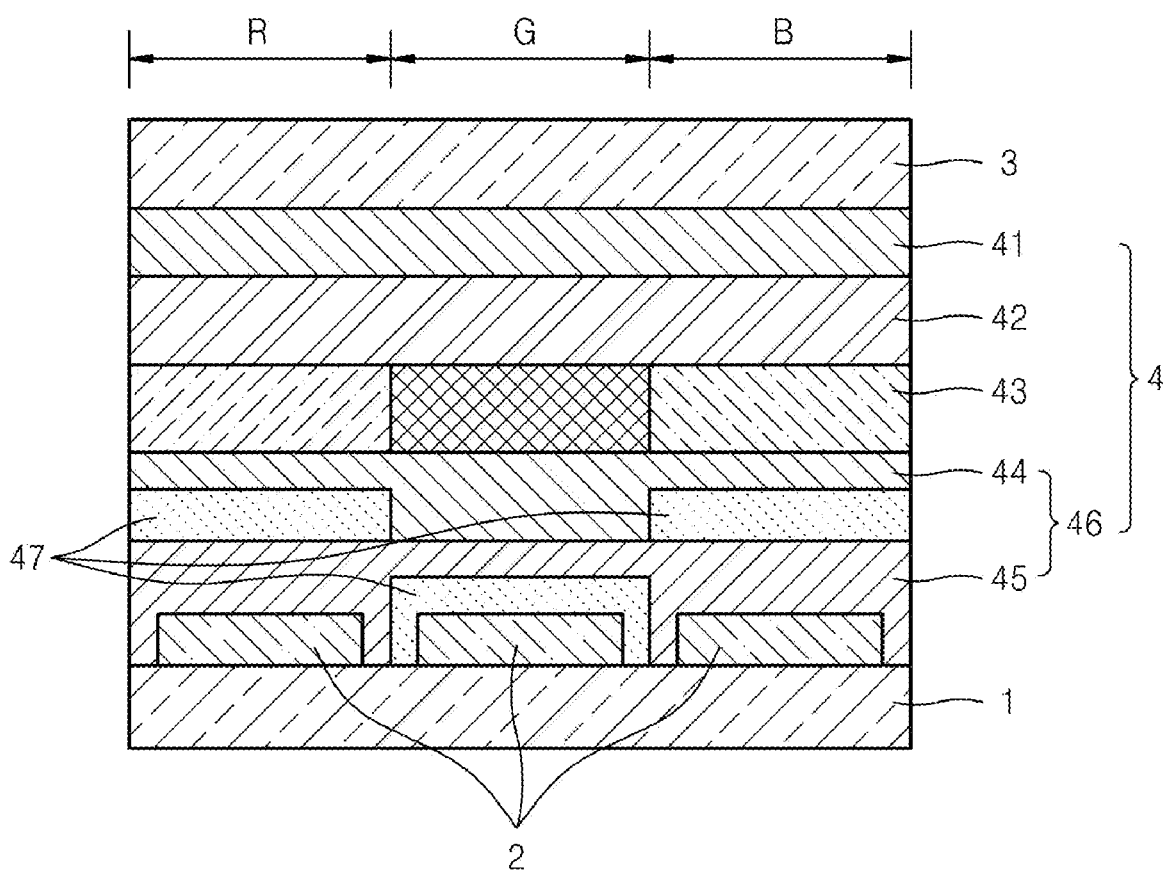
FIG. 1 is a diagram illustrating an organic light emitting display device, according to an embodiment of the present invention.

Reference will now be made in detail to the present embodiments of the present invention, examples of which are illustrated in the accompanying drawings, wherein like reference numerals refer to like elements throughout. The embodiments are described below in order to explain the present invention by referring to the figures. Moreover, it is to be understood that where it is stated herein that one layer is "formed on" or "disposed on" a second layer, the first layer may be formed or disposed directly on the second layer or there may be an intervening layer between the first layer and the second layer. Further, as used herein, the term "formed on" is used with the same meaning as "located on" or "disposed on" and is not meant to be limiting regarding any particular fabrication process.

FIG. 1 is a diagram illustrating an organic light emitting display device, according to an embodiment of the present invention. The organic light emitting display device according to the current embodiment of the present invention includes a first electrode 2 on a substrate 1 and facing a second electrode 3, and an organic layer 4 including an organic light emitting layer 43 disposed between the first and second electrodes 2 and 3.

The substrate 1 may be formed of a transparent glass material having $SiO_2$ as a main component. However, the material forming the substrate 1 is not limited thereto, and may be a plastic or a metal foil. Although not illustrated, the substrate 1 may include at least one thin film transistor and/or a capacitor corresponding to each of the pixels (e.g., R, G, and B), and form a pixel circuit by using such a thin film transistor and capacitor.

When the organic light emitting device is a bottom emission type wherein an image is beamed towards the substrate 1, the first electrode 2 is a transparent electrode and the second electrode 3 is a reflective electrode. The first electrode 2 may be formed of ITO, IZO, ZnO, or $In_2O_3$, all having a high work function, and the second electrode 3 may be formed of a metal having a low work function, such as Ag, Mg, Al, Pt, Pd, Au, Ni, Nd, Ir, Cr, Li, or Ca.

When the organic light emitting device is a top emission type wherein an image is beamed towards the second electrode 3, the first electrode 2 is a reflective electrode and the second electrode 3 is a transparent electrode. Here, the first electrode 2 may be manufactured by forming a reflective film by using Ag, Mg, Al, Pt, Pd, Au, Ni, Nd, Ir, Cr, Li, Ca, or a compound thereof, and then forming ITO, IZO, ZnO, or $In_2O_3$ having a high work function on the reflective film. Also, the second electrode 3 may be manufactured by forming a metal having a low work function, such as Ag, Mg, Al, Pt, Pd, Au, Ni, Nd, Ir, Cr, Li, Ca, or a compound thereof, and then forming an auxiliary electrode layer or a bus electrode line by using a transparent conductive material, such as ITO, IZO, ZnO, or $In_2O_3$, thereon. When the organic light emitting display device is a double side emission type (top and bottom emission type), both the first and second electrodes 2 and 3 may be transparent electrodes.

Meanwhile, when the substrate 1 includes a thin film transistor for each pixel region as described above, the first electrode 2 that is patterned to correspond to each pixel is electrically connected to the thin film transistor corresponding to each pixel. Here, the second electrode 3 may be a common electrode that is connected over all pixels. When the substrate 1 does not include a thin film transistor corresponding to each pixel, the first and second electrodes 2 and 3 may be patterned in a stripe, wherein the first and second electrodes 2 and 3 intersect each other, and operate in a passive matrix (PM).

The organic layer 4 is disposed between the first and second electrodes 2 and 3. The organic layer includes the organic light emitting layer 43 that emits a visible ray. Such an organic light emitting layer 43 may be patterned so as to be separated according to red (R), green (G), and blue (B) pixels. Although in FIGS. 1 and 2, it is illustrated as if the organic light emitting layers 43 of each pixel are connected to each other, the organic light emitting layers 43 are actually separate, each corresponding to a pixel in order to prevent color mixing as shown in FIGS. 3-7.

An electron transport layer 42 and an electron injection layer 41 may be selectively and sequentially formed on the organic light emitting layer 43 between the organic light emitting layer 43 and the second electrode 3. The electron transport layer 42 may be formed by using a vacuum deposition method or a spin coating method, the material thereof is not limited, and $Alq_3$ may be used. The thickness of the electron transport layer 42 may be between 50 and 600 Å, and may vary according to materials of other layers.

The electron injection layer may be selectively deposited on the electron transport layer 42. The electron injection layer 41 may be formed of LiF, NaCl, CsF, $Li_2O$, BaO, or Liq. Also, the thickness of the electron injection layer 41 may be between 1 and 100 Å, but is not limited thereto.

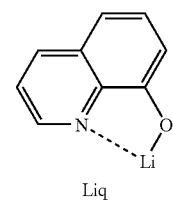

Liq

A hole blocking layer (not shown) may be selectively formed between the organic light emitting layer 43 and the electron transport layer 42, by using a material for blocking a hole. Here, examples of a material for forming the hole blocking layer are not limited, but since the material should have an electron transport capacity while having an ionic potential higher than a light emitting compound, Balq, BCP, or TPBI may be used.

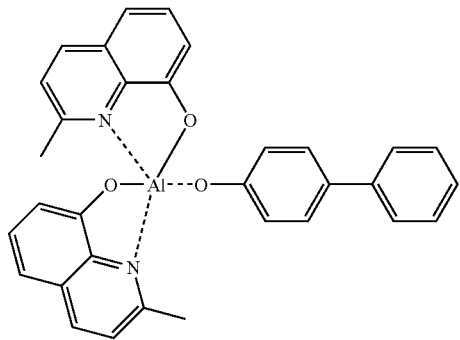

Balq

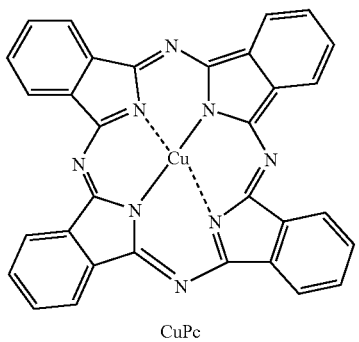

CuPc

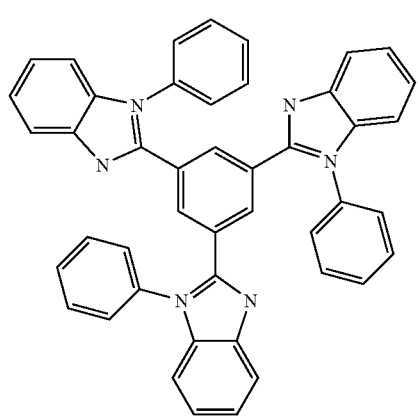

TPBI

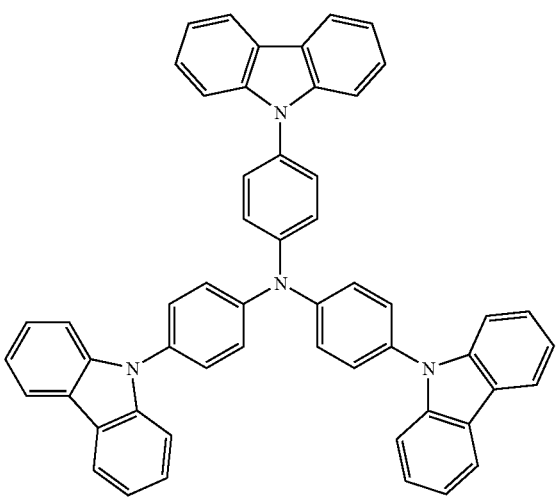

TCTA

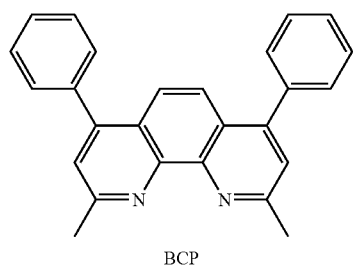

BCP

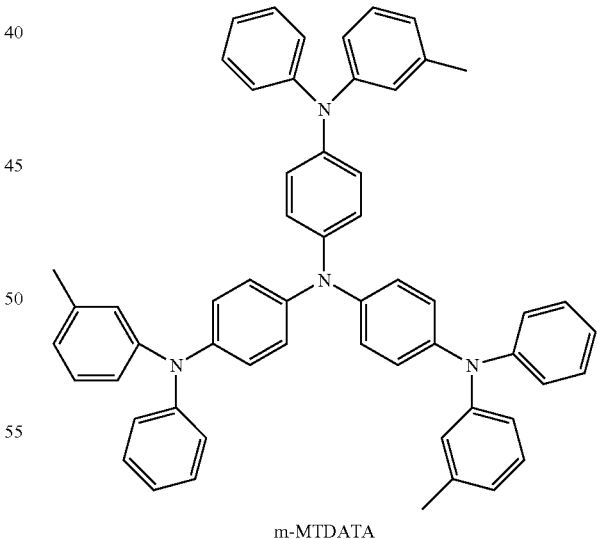

m-MTDATA

Meanwhile, a first layer 46, which includes a hole injection layer 45 and a hole transport layer 44 sequentially formed on the first electrode electrodes 2, is disposed between the first electrode 2 and the organic light emitting layer 43. In the embodiments of FIGS. 1-7, the first layer 46 includes both the hole injection layer 45 and the hole transport layer 44, but the first layer 46 may include either one of the hole injection layer 45 and the hole transport layer 44.

The hole injection layer 45 may use copper phthalocyanine (CuPc) or starburst type amines, such as TCTA, m-MTDATA, and IDE406 (from Idemitsu Kosan Co., Ltd.).

The hole transport layer 44 is selectively formed on the hole injection layer 45 by using a hole transport layer forming material. The hole transport layer forming material is not limited, and may be N,N'-bis(3-methylphenyl)-N,N'-diphenyl-[1,1-biphenyl]-4,4'-diamine(TPD), N,N'-di(naphthalene-1-il)-N,N'-diphenyl benzidine(α-NPD), IDE 320 (from Idemitsu Kosan Co., Ltd.), or the like.

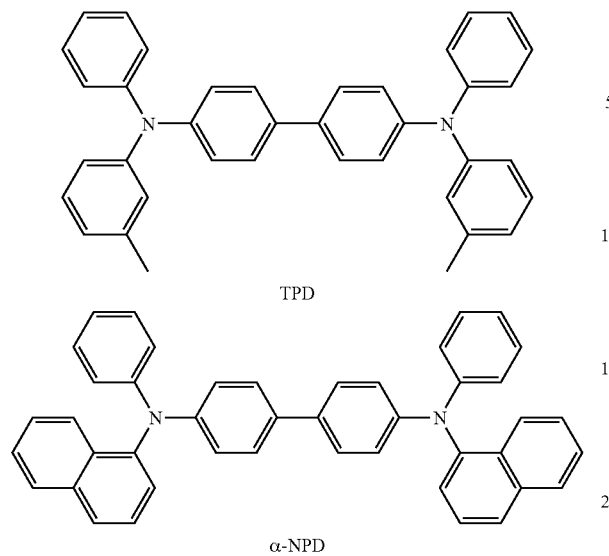

TPD

α-NPD

The first layer 46, the electron transport layer 42, and the electron injection layer 41 as described above are commonly formed over all R, G, and B pixels. Further, a second layer 47 having higher hole injectivity than the hole injection layer 45 and/or the hole transport layer 44, which together are the first layer 46, is formed corresponding to each R, G, and B pixel. Referring to FIG. 1, the second layer is a high mobility hole injection layer 47 having higher hole mobility than the first layer 46. However, when such a high mobility hole injection layer 47 is formed like the first layer 46 as a common layer over all pixels, leakage current may occur as holes transfer to an adjacent pixel because of high mobility of the hole in the high mobility hole injection layer 47.

Accordingly as illustrated in FIG. 1, the high mobility hole injection layers 47 in any one R, G or B pixel are physically and electrically independent of the adjacent pixel. In other words, in the R pixel, the hole injection layer 45 and the high mobility hole injection layer 47 are sequentially formed on the corresponding portion of the first electrode 2, and in the G pixel, the high mobility hole injection layer 47 and the hole injection layer 45 are sequentially formed on the corresponding portion of the first electrode 2. Also, in the B pixel, the hole injection layer 45 and the high mobility hole injection layer 47 are sequentially formed on the corresponding portion of the first electrode 2.

Accordingly, even when a current flows as a voltage is applied to the G pixel, since the high mobility hole injection layers 47 of the G pixel and the R pixel are separate, any light emitting phenomenon from the G pixel does not appear in the R pixel because holes do not move through the adjacent high mobility hole injection layers 47. Similarly, even when a current flows as a voltage is applied to the G pixel, since the high mobility hole injection layers 47 of the G pixel and the B pixel are separate, any light emitting phenomenon from the G pixel does not appear in the B pixel because holes do not move through the adjacent high mobility hole injection layers 47.

Thus, by using the high mobility hole injection layers 47, high efficiency is obtained even in a low voltage and low current, and simultaneously, gray expression is excellent even in a low luminance since leakage current from each pixel is prevented.

The high mobility hole injection layer 47 includes a charge generating material. The charge generating material may include a compound described by the following chemical equation.

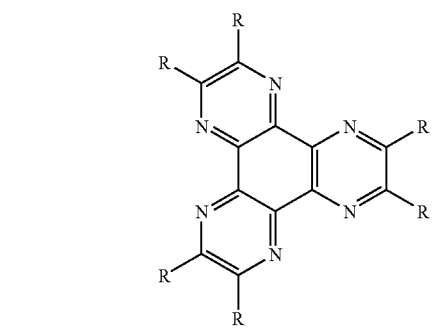

In the above chemical equation, R denotes a nitrile (—CN), a sulfone (—SO$_2$R'), a sulfoxide (—SOR'), a sulfonamide (—SO$_2$NR'$_2$), a sulfonate (—SO$_3$R'), a nitro (—NO$_2$) group, or a trifluoromethane (—CF$_3$) group, and R' denotes a C1-C60 alkyl group, a C1-C60 aryl group, or a C1-C60 heterocyclic group that is substituted or unsubstituted with an amine, an amide, an ether, or an ester.

More specific examples of the above chemical equation are as follows.

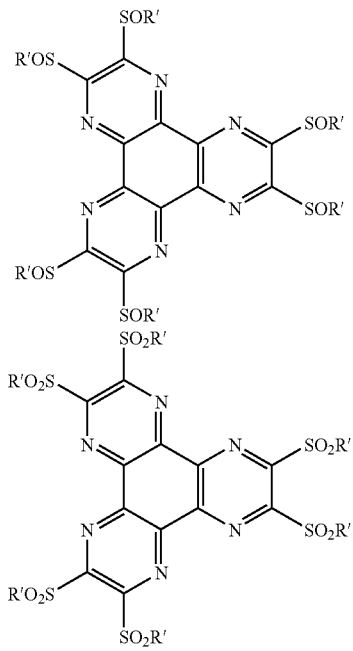

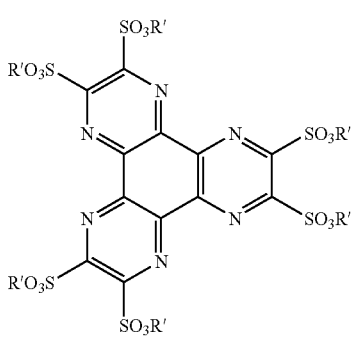

-continued

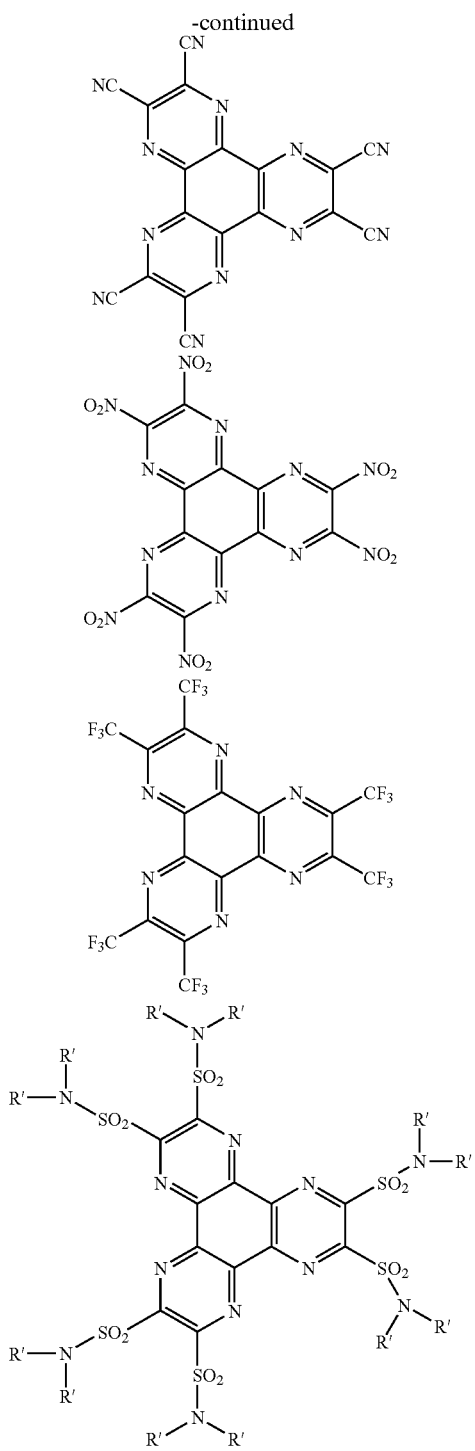

Here, R' denotes a C1-C60 alkyl group, a C1-C60 aryl group, or a C1-C60 heterocyclic group that is substituted or unsubstituted with an amine, an amide, an ether, or an ester. The above specific examples of the charge generating material are only for illustration and ease of understanding, and thus are not limited thereto.

Also, the charge generating material is formed of one of hexanitrile hexaazatriphenylene, tetrafluoro-tetracyanoquinodomethane ($F_4$-TCNQ), ferric chloride, $F_{16}$CuPc, and a metal oxide. Here, the metal oxide may be vanadium pentoxide ($V_2O_5$), rhenium heptoxide ($Re_2O_7$), and indium tin oxide (ITO). The charge generating material of the high mobility hole injection layer 47 may use a material having an energy level, wherein the difference between the LUMO energy level of the charge generating material and the HOMO energy level of a material for forming the hole injection layer 45 is within a range of −2 and +2 eV.

For example, in the case of hexaazatriphenylene, the HOMO energy level is approximately between 9.6 and 9.7 eV and the LUMO energy level is approximately 5.5 eV. In the case of $F_4$-TCNQ, the HOMO energy level is approximately 8.53 eV and the LUMO energy level is approximately 6.23 eV. The HOMO energy level of the material for forming the hole injection layer material 45 used in these aspects of the present invention is approximately between 4.5 and 5.5 eV. Accordingly, when hexaazatriphenylene is used as the charge generating material, the difference between the LUMO energy level and the HOMO energy level is between −1.0 and 0 eV. Also, when $F_4$-TCNQ is used as the charge generating material, the difference between the LUMO energy level and the HOMO energy level is between −0.73 and 1.73 eV.

Figure 2:
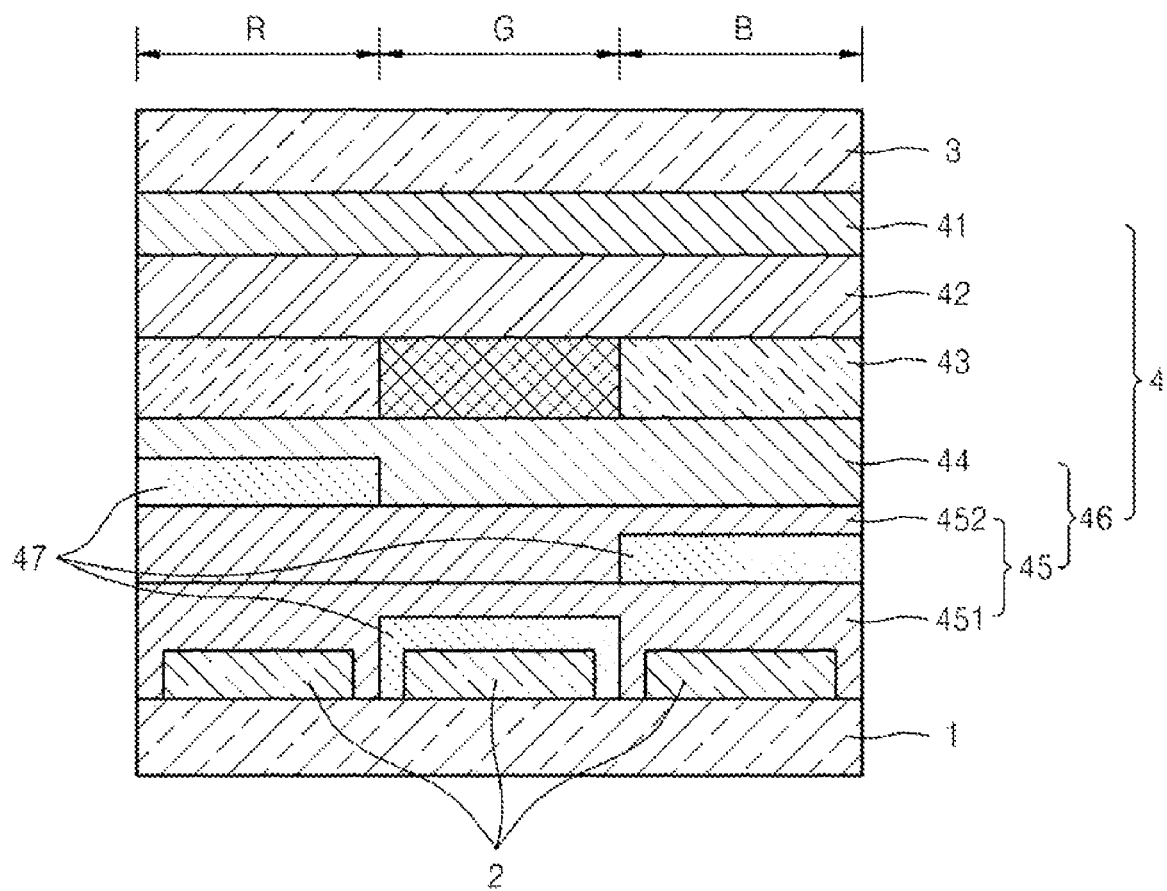
FIG. 2 is a diagram illustrating an organic light emitting display device, according to another embodiment of the present invention.

FIG. 2 is a diagram illustrating an organic light emitting display device, according to another embodiment of the present invention. In FIG. 2, the high mobility hole injection layers 47 corresponding to the R, G, and B pixels are disposed in different layers.

Specifically, the high mobility hole injection layer 47 of the G pixel is first independently deposited on the corresponding portion of the first electrode 2, and then a first hole injection layer 451 is formed as a common layer over all R, G, and B pixels. Then, the high mobility hole injection layer 47 of the B pixel is independently deposited on the first hole injection layer 451, and then a second hole injection layer 452 is formed as a common layer over all R, G, and B pixels. Also, the high mobility hole injection layer 47 of the R pixel is independently deposited on the second hole injection layer 452, and then the hole transport layer 44 is formed as a common layer over all R, G, and B pixels. That is, the two hole injection layers 451 and 452 and the hole transport layer 44 are electrically and physically connected across pixel regions. Meanwhile, the high mobility hole injection layer 47 for any one pixel region is physically and electrically independent of the corresponding layer in adjacent pixel regions.

In other words, the first hole injection layer 451, the second hole injection layer 452, and the high mobility hole injection layer 47 are sequentially deposited on the corresponding portion of the first electrode 2 in the R pixel; the high mobility hole injection layer 47, the first hole injection layer 451, and the second hole injection layer 452 are sequentially deposited on the corresponding portion of the first electrode 2 in the G pixel; and the first hole injection layer 451, the high mobility hole injection layer 47, and the second hole injection layer 452 are sequentially deposited on the corresponding portion of the first electrode in the B pixel. That is, the high mobility hole injection layers 47 are disposed on different layers in each pixel, and thus leakage current can be prevented since hole transport via the high mobility hole injection layer 47 is blocked between adjacent pixels, specifically between adjacent pixels having different colors.

FIGS. 3 through 7 are diagrams illustrating organic light emitting display devices, according to other embodiments of the present invention. Like previous embodiments, in the embodiments in FIGS. 3 through 7, the first electrode 2 on the substrate 1 and the second electrode 3 face each other, and the organic layer 4, which includes the hole injection layer 45, the hole transport layer 44, the organic light emitting layer 43, the electron transport layer 42, and the electron injection layer 41, is formed between the first and second electrodes 2 and 3.

Here, in the embodiments in FIGS. 3 through 7, the high mobility hole injection layer 47 formed of a charge generating material is formed as the second layer that has higher hole injectivity than the hole injection layer 45 and/or hole transport layer 44, which are the first layer 46, of the R, G, and B pixels. By using the high mobility hole injection layer 47, light emitting efficiency is remarkably increased, and as a result, the organic light emitting display device operates at a low voltage.

The thickness of the high mobility hole injection layer 47 may be between 10 and 200 Å, and preferably, between 20 and 80 Å. When the thickness of the high mobility hole injection layer 47 is below 10 Å, the charge generating effect deteriorates, and when the thickness exceeds 200 Å, the driving voltage may increase or cross-talk may occur across pixels due to leakage current.

As described above, in the case of a full color organic light emitting display device, the locations of light emitted in a light emitting layer are different depending on the color of each pixel. Accordingly, as illustrated in FIGS. 3 through 7, the high mobility hole injection layers 47 are differently disposed in at least two different colors from among the R, G, and B pixels. That is, the high mobility injection layers 47 are electrically connected across the pixel regions, but each one is physically independent from the high mobility injection layer in an adjacent pixel region. The locations of the high mobility hole injection layers 47 may differ according to the light emitting locations in the organic light emitting layer 43 of each pixel.

In other words, when the high mobility hole injection layer 47 is closer to the organic light emitting layer 43, the number of holes injected to the organic light emitting layer 43 increases, and thus the possibility increases of light emission as the holes meet electrons. Accordingly, the light emission location in the organic light emitting layer 43 is pushed towards the electron transport layer 42. Thus, in the case of a pixel having a light emitting location in the organic light emitting layer 43 that is close to the electron transport layer 42, the high mobility hole injection layer 47 of the pixel is located farther from the organic light emitting layer 43 than pixels of other colors. Also, in case of a pixel having a light emitting location in the organic light emitting layer 43 that is close to the hole transport layer 44, the high mobility hole injection layer 47 of the pixel is located closer to the organic light emitting layer 43 than pixels of other colors. Consequently, the light emitting locations in the organic light emitting layers 43 in pixels of all colors become uniform, thereby increasing the light emitting efficiency.

Figure 3:
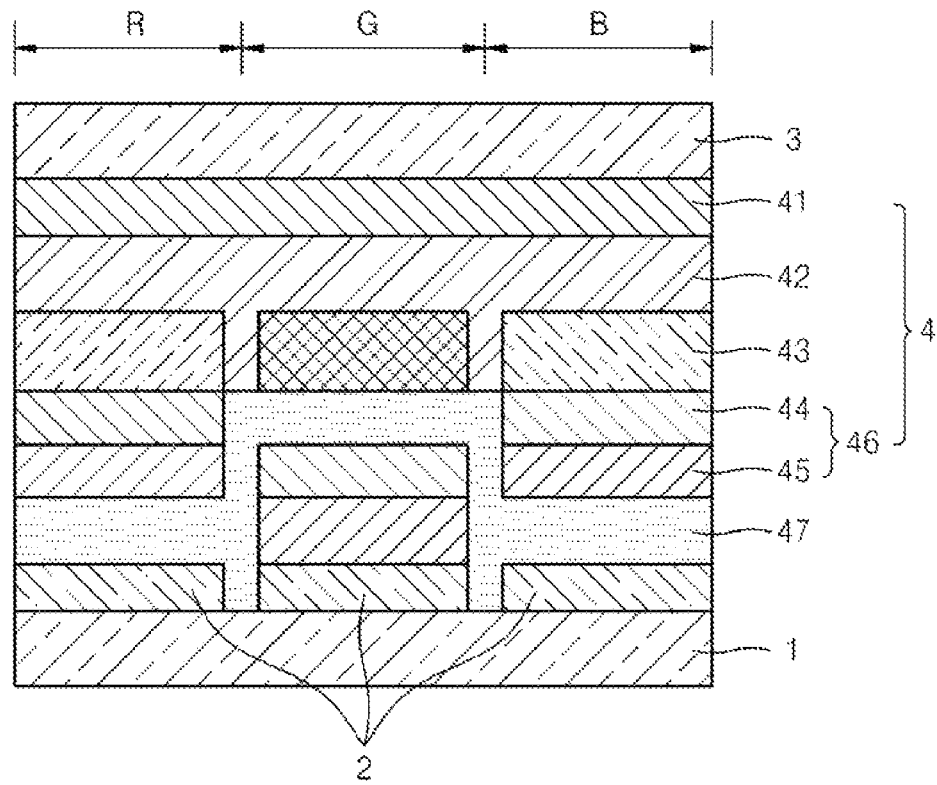
FIG. 3 is a diagram illustrating an organic light emitting display device, according to another embodiment of the present invention.

Accordingly, when the light emitting locations in the organic light emitting layers 43 in the R and B pixels are closer to the electron transport layer 42 than the light emitting location in the organic light emitting layer 43 in the G pixel, the high mobility hole injection layer 47 of the G pixel may be located close to the organic light emitting layer 43 as illustrated in FIG. 3. In other words, as illustrated in FIG. 3, the high mobility hole injection layer 47, the hole injection layer 45, and the hole transport layer 44 are sequentially deposited on the corresponding portion of the first electrode 2 in the R pixel; the hole injection layer 45, the hole transport layer 44, and the high mobility hole injection layer 47 are sequentially deposited on the corresponding portion of the first electrode 2 in the G pixel; and the high mobility hole injection layer 47, the hole injection layer 45, and the hole transport layer 44 are sequentially deposited on the corresponding portion of the first electrode 2 in the B pixel.

That is, the high mobility hole injection layer 47, the hole injection layer 45, and the hole transport layer 44 are deposited in the same order on the R and B pixels, but deposited in a different order on the G pixel. Here, the high mobility hole injection layer 47 of the G pixel is closer to the organic light emitting layer 43 than the high mobility hole injection layers 47 of the R and B pixels, and thus the light emitting location in the organic light emitting layer 43 in the G pixel is pushed towards the electron transport layer 42. As a result, the light emitting locations are uniform in all pixels, thereby increasing the light emitting efficiency. That is, as stated above, in FIG. 3, the high mobility injection layers 47 are electrically connected across the pixel regions, but each one is physically independent from the high mobility injection layer in an adjacent pixel region. Moreover, the hole injection layer 45 and hole transport layer 44 in any one pixel region is physically and electrically independent of the corresponding layer in an adjacent pixel region.

Figure 4:
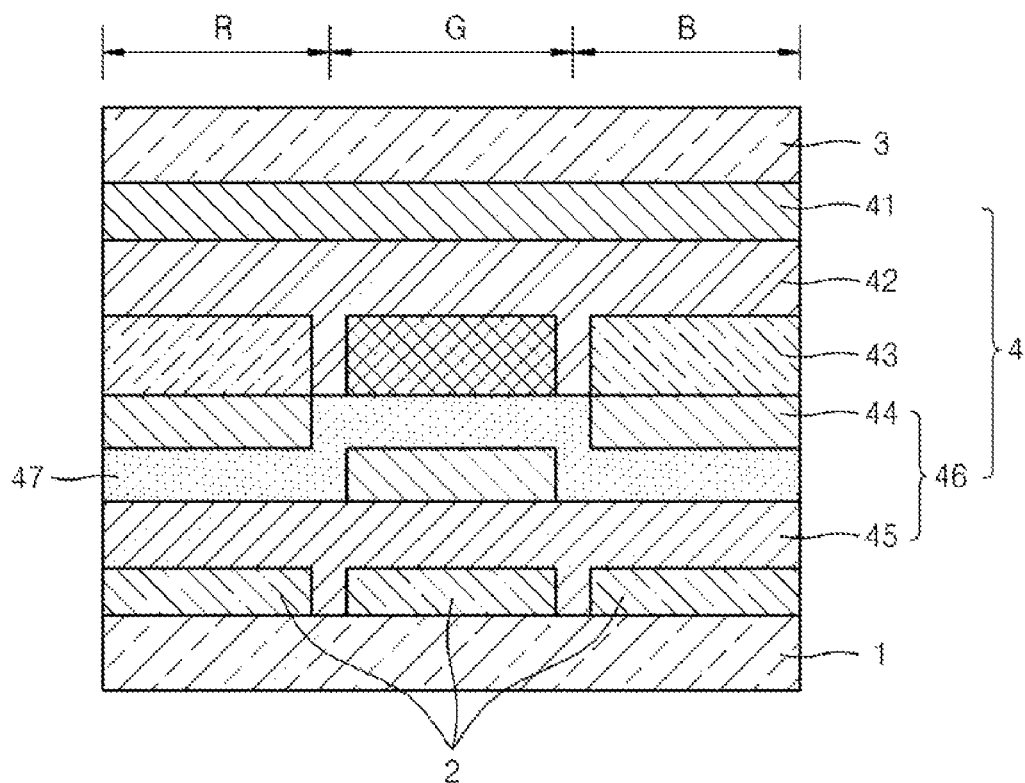
FIG. 4 is a diagram illustrating an organic light emitting display device, according to another embodiment of the present invention.

Referring to FIG. 4, the light emitting locations in the organic light emitting layers 43 in the R and B pixels are closer to the hole transport layer 44 compared to those of FIG. 3. Here, the high mobility hole injection layers 47 of the R and B pixels are closer to the organic light emitting layer 43 than those of FIG. 3.

In other words, as illustrated in FIG. 4, the hole injection layer 45, the high mobility hole injection layer 47, and the hole transport layer 44 are sequentially deposited on the corresponding portion of the first electrode 2 in the R pixel; the hole injection layer 45, the hole transport layer 44, and the high mobility hole injection layer 47 are sequentially deposited on the corresponding portion of the first electrode 2 in the G pixel; and the hole injection layer 45, the high mobility hole injection layer 47, and the hole transport layer 44 are sequentially deposited on the first electrode 2 in the B pixel.

As illustrated in FIG. 4, the hole injection layer 45 is deposited in the same location on the R, G, and B pixels (and therefore, physically and electrically connected), and the high mobility hole injection layer 47 and the hole transport layer 44 are sequentially and similarly deposited on the R and B pixels. The hole transport layer 44 and the high mobility hole injection layer 47 are sequentially deposited on the G pixel in a different order from the R and B pixels. That is, the high mobility injection layers 47 are electrically connected across the pixel regions, but each one is physically independent from the high mobility injection layer 47 in an adjacent pixel region. Meanwhile, the hole injection layer 44 in one pixel region is physically and electrically independent of the corresponding layer in an adjacent pixel region. Accordingly in this case, pixels of each color maintain a uniform light emitting location in the organic light emitting layers 43 as the embodiment in FIG. 3, and thus the light emitting efficiency is increased.

Figure 5:
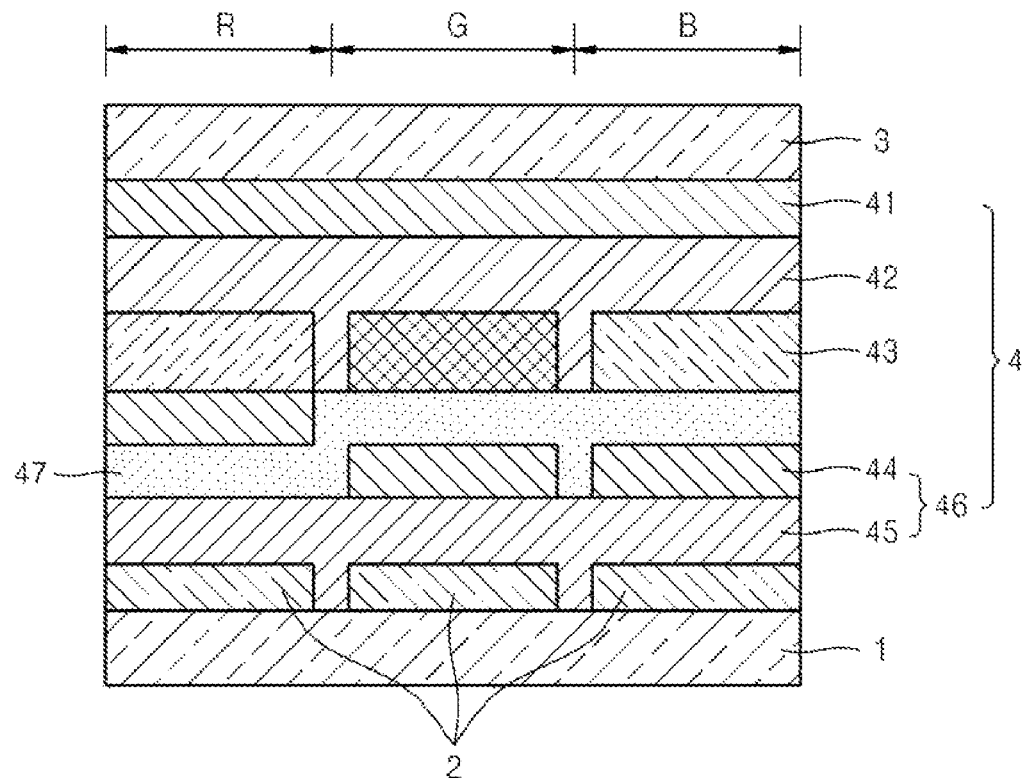
FIG. 5 is a diagram illustrating an organic light emitting display device, according to another embodiment of the present invention.

Referring to FIG. 5, the light emitting location in the organic light emitting layer 43 in the R pixel is closer to the electron transport layer 42 than the light emitting locations in the organic light emitting layers 43 in the G and B pixels. In this case, the high mobility hole injection layers 47 of the B and G pixels are closer to the organic light emitting layer 43 than that of the R pixel.

In other words, as illustrated in FIG. 5, the hole injection layer 45, the high mobility hole injection layer 47, and the hole transport layer 44 are sequentially deposited on the corresponding portion of the first electrode 2 in the R pixel; and the hole injection layer 45, the hole transport layer 44, and the high mobility hole injection layer 47 are sequentially deposited on the corresponding portion of the first electrode 2 in the G and B pixels.

The hole injection layers 45 are deposited in the same location on the R, G, and B pixels (and therefore, physically and electrically connected), while the high mobility injection layer 47 and the hole transport layer 44 are sequentially deposited in the same order only on the G and B pixels. The hole transport layer 44 and the high mobility hole injection layer 47 are sequentially deposited in a different order on the R pixel. That is, similarly to FIG. 4, in FIG. 5, the high mobility injection layers 47 are electrically connected across the pixel regions, but each one is physically independent from the high mobility injection layer 47 in an adjacent pixel region. Meanwhile, the hole injection layer 44 in one pixel region is physically and electrically independent of the corresponding layer in an adjacent pixel region. Accordingly, pixels of each color maintain a uniform light emitting location in the organic light emitting layers 43, and thus the light emitting efficiency is increased.

Figure 6:
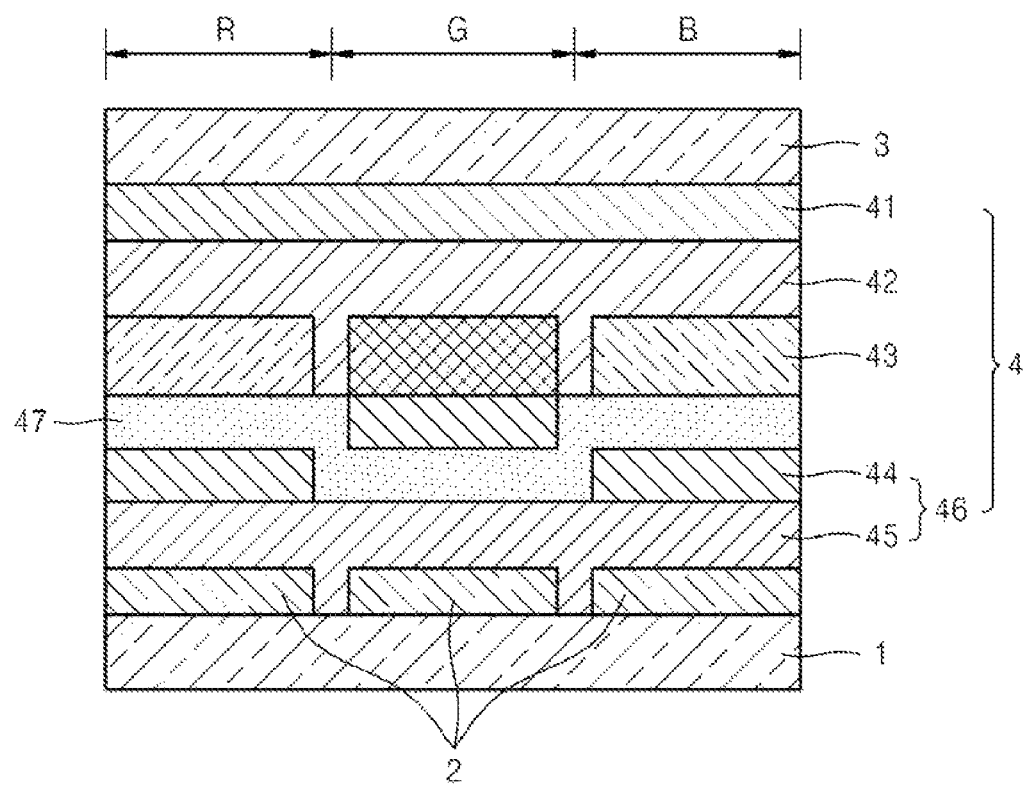
FIG. 6 is a diagram illustrating an organic light emitting display device, according to another embodiment of the present invention.

Referring to FIG. 6, the light emitting location in the organic light emitting layer 43 in the G pixel is closer to the electron transport layer 42 than the light emitting locations in the organic light emitting layers 43 in the R and B pixels. In this case, the high mobility hole injection layers 47 of the R and B pixels are closer to the organic light emitting layer 43 than that of the G pixel.

In other words, as illustrated in FIG. 6, the hole injection layer 45, the hole transport layer 44, and the high mobility hole injection layer 47 are sequentially deposited on the corresponding portion of the first electrode 2 in the R and B pixels; and the hole injection layer 45, the high mobility hole injection layer 47, and the hole transport layer 44 are sequentially deposited on the corresponding portion of the first electrode 2 in the G pixel.

The hole injection layers 45 are deposited in the same location on the R, G, and B pixels (and therefore, physically and electrically connected), and the hole transport layer 44 and the high mobility hole injection layer 47 are sequentially deposited in the same order on the R and B pixels. The high mobility hole injection layer 47 and the hole transport layer 44 are sequentially deposited in different order on the G pixel. That is, similarly to FIGS. 4 and 5, in FIG. 6, the high mobility injection layers 47 are electrically connected across the pixel regions, but each one is physically independent from the high mobility injection layer 47 in an adjacent pixel region. Meanwhile, the hole injection layer 44 in one pixel region is physically and electrically independent of the corresponding layer in an adjacent pixel region. Accordingly, pixels of each color maintain a uniform light emitting location in the organic light emitting layers 43, and thus the light emitting efficiency is increased.

Figure 7:
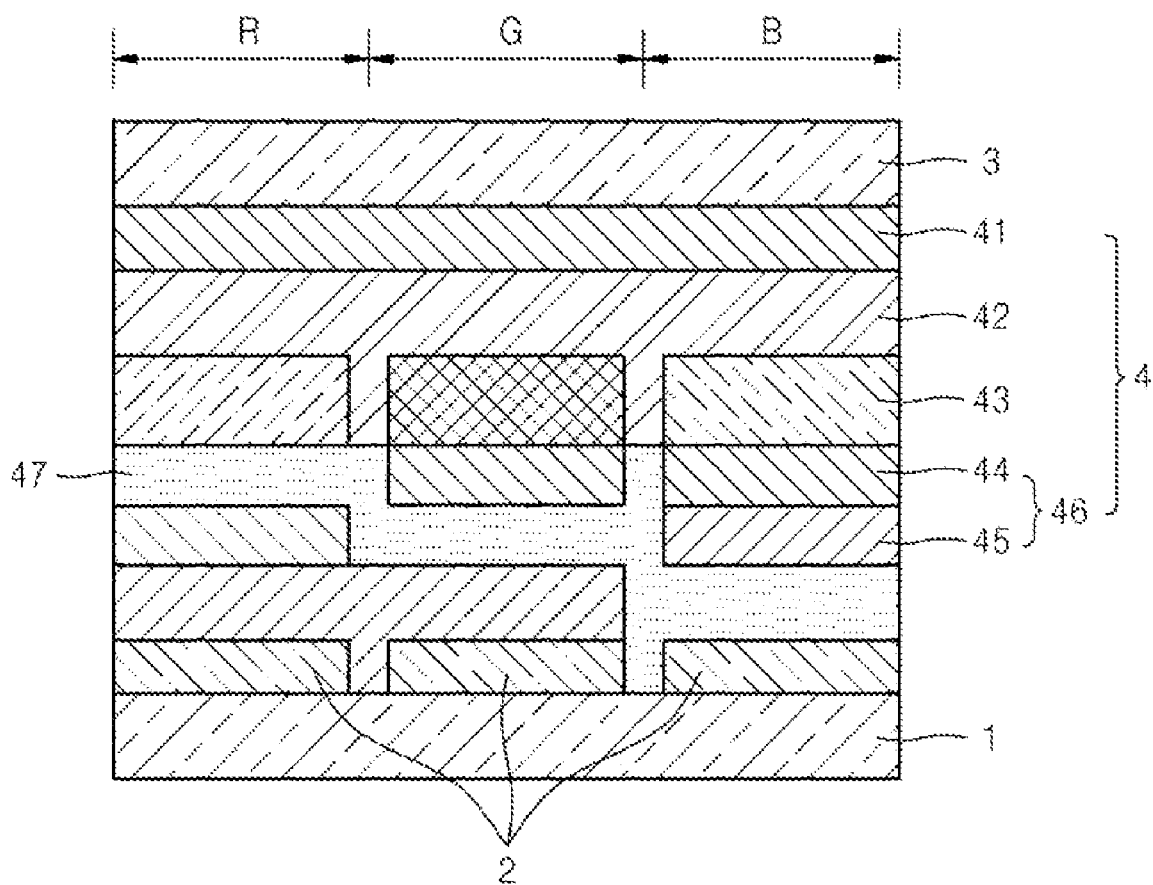
FIG. 7 is a diagram illustrating an organic light emitting display device, according to another embodiment of the present invention.

Referring to FIG. 7, the light emitting locations in the organic light emitting layers 43 are closer to the electron transport layer 42 in the order of B, G, and R pixels. In this case, the high mobility hole injection layer 47 of the R pixel is closer to the organic light emitting layer 43 than those of the G and B pixels, and the high mobility hole injection layer 47 of the G pixel is closer to the organic light emitting layer 43 than that of the B pixel.

In other words, as illustrated in FIG. 7, the hole injection layer 45, the hole transport layer 44, and the high mobility hole injection layer 47 are sequentially deposited on the corresponding portion of the first electrode 2 in the R pixel; the hole injection layer 45, the high mobility hole injection layer 47, and the hole transport layer 44 are sequentially deposited on the corresponding portion of the first electrode 2 in the G pixel; and the high mobility hole injection layer 47, the hole injection layer 45, and the hole transport layer 44 are sequentially deposited on the corresponding portion of the first electrode in the B pixel.

The hole injection layers 45 are deposited in the same location on the R and G pixels, and the hole transport layers 44 are deposited in the same location on the G and B pixels. The high mobility hole injection layer 47 is deposited in a separate location on each of the R, G, and B pixels. FIG. 7 is more complex than FIGS. 4-6. That is, the high mobility injection layers 47 are electrically connected across the pixel regions, but each one is physically independent from the high mobility injection layer 47 in an adjacent pixel region. Meanwhile, depending on the pixel region, the hole injection layers 45 may either be physically and electrically connected to the corresponding layers in adjacent pixel regions (R and G), or may be physically and electrically independent of the corresponding layer in adjacent pixel regions (B) while the hole transfer layers 44 are physically and electrically independent of the corresponding layer in an adjacent pixel region. Accordingly, pixels of each color maintain a uniform light emitting location in the organic light emitting layers 43, and thus the light emitting efficiency is increased.

The above deposition examples may vary according to the light emitting locations in the organic light emitting layer 43. In the above embodiments, since the high mobility hole injection layers 47 having the higher hole injectivity than the hole injection layer 45 and/or the hole transport layer 44 are physically or electrically independent in at least two different colors, any leakage current between pixels can be reduced.

In other words, in these aspects of the present invention, by using a second layer having high hole injectivity, high efficiency can be obtained even in low voltage and low current, and simultaneously, any leakage current in each pixel can be prevented. Accordingly, gray expression in low luminance is possible. Moreover, light emitting locations in organic light emitting layers in pixels of all colors are uniform, and thus the light emitting efficiency can be increased.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting display device comprising:
   a first pixel region emitting a first color;
   a second pixel region emitting a second color different from the first color;
   a first layer formed over the first and second pixel regions, and having a hole transport layer and at least one of hole injection layers; and
   a second layer formed over the first and second pixel regions, and having a hole injectivity higher than the first layer,
   wherein the first and second layers are sequentially deposited in the first pixel region, and the second and first layers are sequentially deposited in the second pixel region.

2. The organic light emitting display device of claim 1, wherein the second layer is a hole injection layer having higher charge mobility than the at least one of the hole injection layers of the first layer.

3. The organic light emitting display device of claim 2, wherein the first layer is physically and electrically connected over the first and second pixel regions.

4. The organic light emitting display device of claim 2, wherein the second layer in the first pixel region is physically independent of the corresponding second layer in the second pixel region.

5. The organic light emitting display device of claim 1, wherein the second layer comprises a charge generating material.

6. The organic light emitting display device of claim 1, wherein the first layer includes both the hole transport layer and the at least one of the hole injection layers, and one layer of the hole injection layers and the hole transport layer is physically and electrically connected over the first and second pixel regions.

7. The organic light emitting display device of claim 1, wherein the first and second layers on the first pixel region are each physically and electrically independent of the corresponding layer on the second pixel region.

8. The organic light emitting display device of claim 5, wherein the charge generating material is a chemical compound described by the following chemical formula:

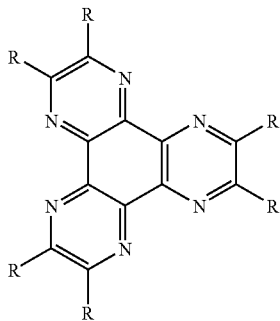

wherein R is a nitrile (—CN), a sulfone (—SO$_2$R'), a sulfoxide (—SOR'), a sulfonamide (—SO$_2$NR'$_2$), a sulfonate (—SO$_3$R'), a nitro (—NO$_2$) group, or a trifluoromethane (—CF$_3$) group, and wherein R' is a C$_1$-C$_{60}$ alkyl group, a C$_5$-C$_{60}$ aryl group, or a C$_2$-C$_{60}$ heterocyclic group that is substituted or unsubstituted with an amine, an amide, an ether, or an ester.

9. The organic light emitting display device of claim 5, wherein the charge generating material is formed of a material selected from the group consisting of hexanitrile hexaazatriphenylene, tetrafluoro-tetracyanoquinodomethane (F$_4$-TCNQ), ferric chloride, F$_{16}$CuPc, and a metal oxide.

10. The organic light emitting display device of claim 9, wherein the metal oxide is selected from the group consisting of vanadium pentoxide (V$_2$O$_5$), rhenium heptoxide (Re$_2$O$_7$), and indium tin oxide (ITO).

11. The organic light emitting display device of claim 5, wherein the difference between the LUMO energy level of the charge generating material in the second layer, and the HOMO energy level of a material forming the hole injection layer in the first layer is within a range of −2 and +2 eV.

12. The organic light emitting display device of claim 5, wherein the thickness of the second layer is between 10 and 200 Å.

13. The organic light emitting display device of claim 5, wherein the thickness of the second layer is between 20 and 80 Å.

14. An organic light emitting display device comprising:
a plurality of pixel regions, each emitting, respectively, a color;
a layer comprising a hole transport layer and at least one of hole injection layers; and
a high mobility hole injection layer, wherein:
the high mobility hole injection layer has a higher hole injectivity than the at least one of hole injection layers and the hole transport layer,
the high mobility hole injection layer has a higher charge mobility than the at least one of hole injection layers,
the colors of the plurality of pixel regions are at least red, blue and green,
the at least one of hole injection layers, the high mobility hole injection layer and the hole transport layer are physically or electrically connected over a plurality of pixel regions, and
the stacking position of the high mobility hole injection layer in one pixel is different from that of the high mobility hole injection layer in an adjacent pixel.

15. The organic light emitting display device of claim 14, wherein the at least one of hole injection layers, the high mobility hole injection layer and the hole transport layer are deposited sequentially on at least one of the pixel regions.

16. The organic light emitting display device of claim 14, wherein the at least one of hole injection layers, the hole transport layer and the high mobility hole injection layer are deposited sequentially on at least one of the pixel regions.

17. The organic light emitting display device of claim 14, wherein the high mobility hole injection layer, the at least one of hole injection layers and the hole transport layer are deposited sequentially on at least one of the pixel regions.

18. The organic light emitting display device of claim 14, wherein one of the hole injection layers, the high mobility hole injection layer, another one of the hole injection layers and the hole transport layer are deposited sequentially on the blue pixel region.

19. The organic light emitting display device of claim 14, wherein the high mobility hole injection layer comprises a charge generating material.

20. The organic light emitting display device of claim 19, wherein the charge generating material is a chemical compound described by the following chemical formula:

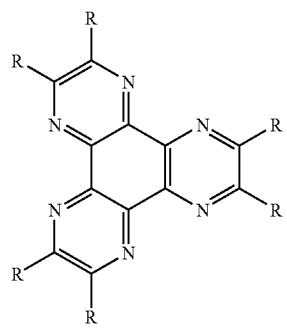

wherein R is a nitrile (—CN), a sulfone (—SO$_2$R'), a sulfoxide (—SOR'), a sulfonamide (—SO$_2$NR'$_2$), a sulfonate (—SO$_3$R'), a nitro (—NO$_2$) group, or a trifluoromethane (—CF$_3$) group, and wherein R' is a C$_1$-C$_{60}$ alkyl group, a C$_5$-C$_{60}$ aryl group, or a C$_2$-C$_{60}$ heterocyclic group that is substituted or unsubstituted with an amine, an amide, an ether, or an ester.

21. The organic light emitting display device of claim 19, wherein the charge generating material is formed of a material selected from the group consisting of hexanitrile hexaazatriphenylene, tetrafluoro-tetracyanoquinodomethane (F$_5$-TCNQ), ferric chloride, F$_{16}$CuPc, and a metal oxide.

22. The organic light emitting display device of claim 21, wherein the metal oxide is selected from the group consisting of vanadium pentoxide (V$_2$O$_5$), rhenium heptoxide (Re$_2$O$_2$), and indium tin oxide (ITO).

23. The organic light emitting display device of claim 19, wherein the difference between the LUMO energy level of the charge generating material in the high mobility hole injection layer, and the HOMO energy level of a material forming the hole injection layer is within a range of −2 and +2 eV.

24. The organic light emitting display device of claim 19, wherein the thickness of the high mobility hole injection layer is between 10 and 200 Å.

25. The organic light emitting display device of claim 19, wherein the thickness of the high mobility hole injection layer is between 20 and 80 Å.

* * * * *